(12) United States Patent
Shin

(10) Patent No.: US 8,097,517 B2
(45) Date of Patent: Jan. 17, 2012

(54) METHOD FOR MANUFACTURING SEMICONDUCTOR DEVICE WITH IMPROVED SHORT CHANNEL EFFECT OF A PMOS AND STABILIZED CURRENT OF A NMOS

(75) Inventor: Min Jung Shin, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/791,131

(22) Filed: Jun. 1, 2010

(65) Prior Publication Data
US 2010/0240178 A1    Sep. 23, 2010

Related U.S. Application Data

(62) Division of application No. 11/968,869, filed on Jan. 3, 2008, now abandoned.

(30) Foreign Application Priority Data

Nov. 14, 2007    (KR) .................. 10-2007-0116055

(51) Int. Cl.
*H01L 21/8238* (2006.01)

(52) U.S. Cl. ........ 438/300; 438/200; 438/230; 438/591; 438/769; 438/770; 438/775; 438/552; 438/199; 438/201; 438/202; 438/287; 438/307; 438/648; 438/655; 438/341; 438/357; 438/547; 438/442

(58) Field of Classification Search ............ 438/591, 438/769, 770, 775, 552, 199–202, 287–307, 438/648–655, 341, 357, 547, 442; 257/371
See application file for complete search history.

(56) References Cited

U.S. PATENT DOCUMENTS

| 5,268,324 | A | 12/1993 | Aitken et al. |
| 5,882,993 | A * | 3/1999 | Gardner et al. ............... 438/591 |
| 7,192,822 | B2 | 3/2007 | Park et al. |
| 7,195,985 | B2 * | 3/2007 | Murthy et al. ............... 438/341 |

(Continued)

FOREIGN PATENT DOCUMENTS

KR    1019930015758 A    8/1993
(Continued)

OTHER PUBLICATIONS

USPTO OA mailed Apr. 15, 2009 for U.S. Appl. No. 11/968,869.
USPTO OA mailed Aug. 17, 2009 for U.S. Appl. No. 11/968,869.
USPTO OA mailed Mar. 11, 2010 for U.S. Appl. No. 11/968,869.

*Primary Examiner* — Wai Sing Louie
*Assistant Examiner* — Bilkis Jahan
(74) *Attorney, Agent, or Firm* — Ladas & Parry LLP

(57) ABSTRACT

The present invention relates to a semiconductor device which is capable of simultaneously improving a short channel effect of a PMOS and the current of an NMOS and a method for manufacturing the same. The semiconductor device includes first and second gates formed over first and second areas of a semiconductor substrate, respectively; and first and second junction areas formed in a portion of the semiconductor substrate corresponding to both sides of the first gate and a portion of the semiconductor substrate corresponding to both sides of the second gate, and including a projection, respectively, wherein the projection of the first junction area has a height higher than the height of the projection of the second junction area, and the second junction area is formed such that it has a depth from the surface of the semiconductor substrate deeper than the depth of the first junction area.

4 Claims, 4 Drawing Sheets

| U.S. PATENT DOCUMENTS | | | |
|---|---|---|---|
| 2005/0127408 A1 | 6/2005 | Doris et al. | |
| 2005/0280098 A1* | 12/2005 | Shin et al. | 257/371 |
| 2006/0131656 A1 | 6/2006 | Shin et al. | |
| 2008/0099846 A1 | 5/2008 | Ohta | |
| 2010/0240178 A1* | 9/2010 | Shin | 438/230 |

| FOREIGN PATENT DOCUMENTS | | |
|---|---|---|
| KR | 1020010110769 A | 12/2001 |
| KR | 1020050121479 A | 12/2005 |
| KR | 1020060069561 A | 6/2006 |

* cited by examiner

METHOD FOR MANUFACTURING SEMICONDUCTOR DEVICE WITH IMPROVED SHORT CHANNEL EFFECT OF A PMOS AND STABILIZED CURRENT OF A NMOS

CROSS-REFERENCE TO RELATED APPLICATIONS

The present application claims priority to Korean patent application number 10-2007-0116055 filed on Nov. 14, 2007, which is incorporated herein by reference in its entirety.

BACKGROUND OF THE INVENTION

The present invention relates to a semiconductor device and a method for manufacturing the same, and more particularly to a semiconductor device which is capable of simultaneously improving the short channel effect of a PMOS and stabilizing the current of an NMOS and a method for manufacturing the same.

The gate material of a MOSFET device is mainly made of a polysilicon layer, because the polysilicon layer displays the physical properties required in a manufacturing process for a semiconductor device, such as a high melting point, ease of forming a thin film, ease of patterning a line, stability in an oxidation atmosphere and formation of a planarized surface. In an actual MOSFET device, a polysilicon gate contains a dopant such as phosphorous (P), arsenic (As) or boron (B), thereby ensuring low resistance.

Also, in a CMOS device, an NMOS and PMOS are all formed with an N$^+$ polysilicon gate. In this case, the NMOS has a surface channel and the PMOS has a buried channel by a count doping.

Meanwhile, as the level of integration of semiconductor devices increases the width of the gate electrode has decreased. Unlike the NMOS having a surface channel, the PMOS is disadvantaged by an increase in short channel effect, such as the punch-through phenomenon, due to the buried channel.

Accordingly, there has been suggested a method in which an elevated source/drain area is formed on both sides of the polysilicon gate. The elevated source/drain area increases the effective channel length thereby improving the short channel effect of the PMOS.

However, in the prior art described above, it is difficult to increase the current since the elevated source/drain area is formed with a shallow depth within the semiconductor substrate. Therefore, the prior art is limited in its ability to ensure the stability of the current of the NMOS.

Also, because the NMOS has a larger variation in current as compared to the PMOS, it is important to ensure the stability of the current of the NMOS device in order to enhance the operational characteristics of the semiconductor device. No method, however, has been developed which is capable of simultaneously improving the short channel effect of the PMOS and ensuring the stability of the current of the NMOS. Therefore, it is necessary to find the solution.

SUMMARY OF THE INVENTION

Embodiments of the present invention are directed to a semiconductor device which is capable of simultaneously improving the short channel effect of a PMOS and the current of an NMOS and a method for manufacturing the same.

In one embodiment, a semiconductor device comprises first and second gates formed over first and second areas of a semiconductor substrate, respectively; and first and second junction areas formed in a portion of the semiconductor substrate corresponding to both sides of the first gate and a portion of the semiconductor substrate corresponding to both sides of the second gate, and including a projection, respectively, wherein the projection of the first junction area has a height higher than the height of the projection of the second junction area, and the depth of the second junction area is deeper than the depth of the first junction area.

The first area is a PMOS area and the second area is an NMOS area.

The first and second gates are made of a structure which includes an N$^+$ polysilicon layer.

The projections of the first and second junction areas are made of an epitaxial layer.

The epitaxial layer includes a SiGe layer.

In another embodiment, a method for manufacturing a semiconductor device comprises the steps of forming first and second gates over the first and second areas of a semiconductor substrate, respectively; selectively ion implanting impurities into a surface of the semiconductor substrate corresponding to both sides of the first gate; growing first and second epitaxial layers over the portion of the semiconductor substrate corresponding to both sides of the first gate into which the impurities are ion implanted and a portion of the semiconductor substrate corresponding to both sides to of the second gate, respectively, such that the epitaxial layer has a higher height over the portion of the semiconductor substrate corresponding to both sides of the first gate into which the impurities are ion implanted; and forming a first junction area in a portion of the semiconductor substrate corresponding to both sides is of the first gate including the first epitaxial layer and forming a second junction area having a depth from the surface of the semiconductor substrate deeper than that of the first junction area in a portion of the semiconductor substrate corresponding to both sides of the second gate including the second epitaxial layer.

The first area is a PMOS area and the second area is an NMOS area.

The first and second gates are formed in a structure which includes an N$^+$ polysilicon layer.

The step of selectively ion implanting the impurities into the surface of the semiconductor substrate corresponding to both sides of the first gate is performed using P-type impurities.

The P-type impurities include boron (B).

The step of growing the epitaxial layer is performed through a selective epitaxial growth (SEG) process.

The epitaxial layer is grown to a SiGe layer.

DESCRIPTION OF SPECIFIC EMBODIMENTS

In the present invention, P-type impurities are selectively ion implanted into an area of the surface of a semiconductor substrate corresponding to both sides of a first gate of the semiconductor substrate having a PMOS area formed with the first gate and an NMOS area formed with a second gate. After that, an epitaxial layer is grown over the semiconductor substrate corresponding to both sides of the first and second gates such that it has a higher height over the semiconductor substrate corresponding to both sides of the first gate into which the P-type impurities are ion implanted. Impurities are then ion implanted into the epitaxial layer and the surface of the semiconductor substrate below the epitaxial layer to form an elevated source/drain area.

By doing this, it is possible to form a source/drain area with a shallow depth within the surface of the semiconductor substrate at both sides of the first gate of the PMOS area into which the P-type impurities are ion implanted, and a source/drain area having a relatively deeper depth within the surface of the semiconductor substrate at both sides of the second gate of the NMOS area into which the P-type impurities are not ion implanted.

Therefore, in the present invention, it is possible to enhance the operational characteristics of the device by both improving the short channel effect and increasing the current of the PMOS through an increase in the effective channel length.

Hereafter, a preferred embodiment of the present invention will be described in detail with reference to the accompanying drawings.

Figure 1:
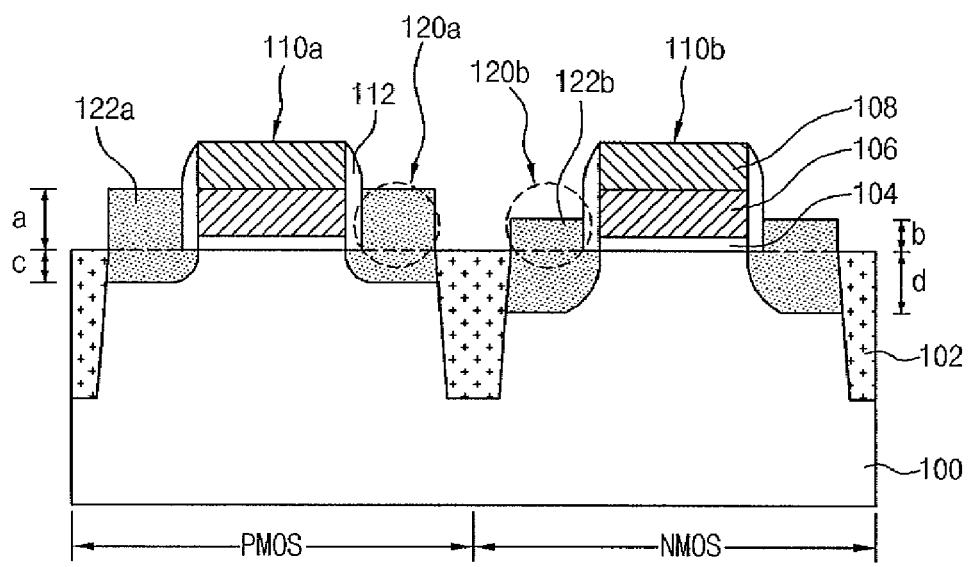
FIG. 1 is a cross-sectional view showing a semiconductor device in accordance with an embodiment of the present invention.

FIG. 1 is a cross-sectional view illustrating a semiconductor device in accordance with an embodiment of the present invention.

As shown, in a semiconductor substrate 100 having a PMOS area and an NMOS area, an isolation layer 102 isolates the PMOS area from the NMOS area. The PMOS area of the semiconductor substrate 100 is formed with a first gate 110a and the NMOS area is formed with a second gate 110b. The first and second gates 110a and 110b include a stacked structure of a gate insulation layer 104, a gate conductive layer 106 and a gate hard mask layer 108. The gate conductive layer 106 includes an N$^+$ polysilicon layer.

A portion of the semiconductor substrate 100 corresponding to both sides of the first gate 110a is formed with a first junction area 122a made of a P-type ion implantation layer and a portion of the semiconductor substrate 100 corresponding to both sides of the second gate 110b is formed with a second junction area 122b. The first and second junction areas 122a and 122b have an elevated structure including, respectively, first and second projections 120a and 120b formed over the semiconductor substrate 100. The first and second projections 120a and 120b are made of an epitaxial layer, e.g. an ion implanted epitaxial SiGe layer.

Herein, the first junction area 122a formed in the PMOS area includes the first projection 120a having, on the semiconductor substrate 100, a height a higher than the height b of the second projection 120b in the second junction area 122b (a>b), and formed so as to have, within the surface of the semiconductor substrate 100, a depth c shallower than the depth d of the second junction area 122b (c<d).

Also, the second junction area 122b formed in the NMOS area includes the second projection 120b having, on the semiconductor substrate 100, a height b lower than the height a of the first projection 120a in the first junction area 122a (b<a), and formed so as to have, within the surface of the semiconductor substrate 100, a depth d deeper than the depth c of the first junction area 122a (d>c).

Therefore, in the semiconductor device of the present invention described above, since the first junction area 122a formed in the PMOS area is formed so as to have the shallow depth c within the surface of the semiconductor substrate 100, the effect channel length is increased thereby improving the short channel effect. Also, in the semiconductor device of the present invention described above, since the second junction area 122b formed in the NMOS area is formed so as to have the deep depth d within the surface of the semiconductor substrate 100, the current of the NMOS area is increased to improve operational characteristics of the device. Therefore, in the present invention, the short channel effect of the PMOS and the current of the NMOS are simultaneously improved.

FIGS. 2A through 2D are cross-sectional views illustrating the process steps of a method for manufacturing a semiconductor device in accordance with an embodiment of the present invention.

Figure 2A:
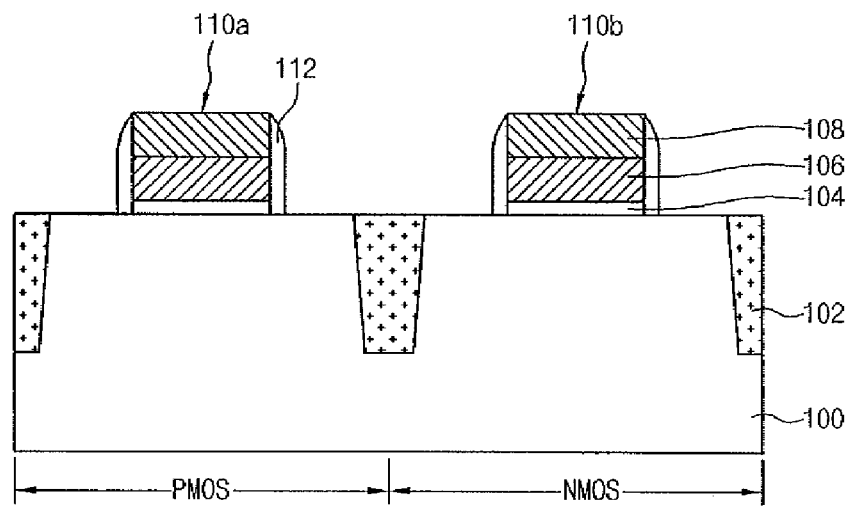
FIGS. 2A through 2D are cross-sectional views for illustrating the process steps of a method for manufacturing a semiconductor device in accordance with an embodiment of the present invention.

Referring to FIG. 2A, in a semiconductor substrate 100 having a PMOS area and an NMOS area, an isolation layer 102 isolates the PMOS area from the NMOS area. Impurities different from each other are ion implanted into each area of the semiconductor substrate 100 formed with the isolation layer 102 respectively to form wells (not shown)

A gate insulation layer 104, a gate conductive layer 106 and a gate hard mask layer 108 are sequentially formed over the PMOS area and the NMOS area of the semiconductor substrate 100. The gate conductive layer 106 formed in each area is formed so as to include an N$^+$ polysilicon layer. The gate hard mask layer 108, the gate conductive layer 106 and the gate insulation layer 104 are etched to form a first gate 110a in the PMOS area and a second gate 110b in the NMOS area. Spacers 112 are formed at both walls of the first and second gates 110a and 110b.

Figure 2B:
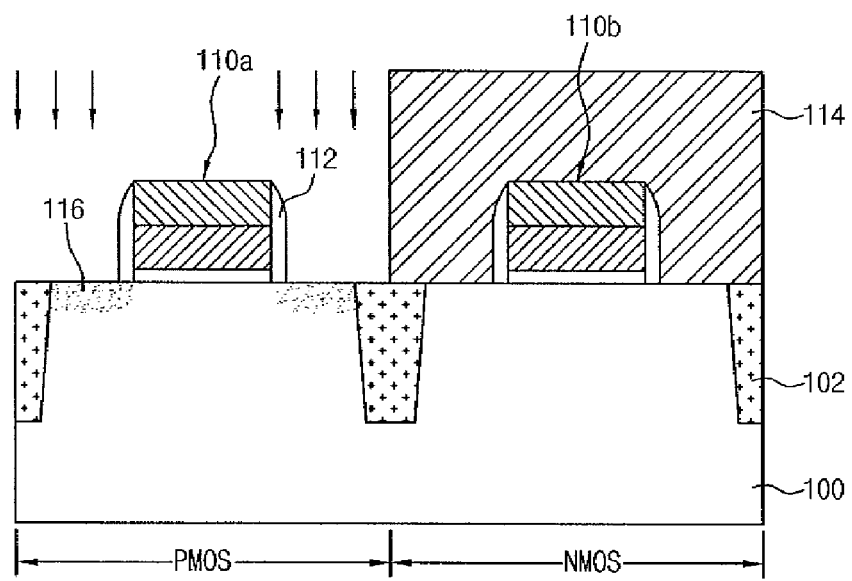

Referring to FIG. 2B, a mask pattern 114 which covers the NMOS area of the semiconductor substrate 100 but exposes the PMOS area is formed over the semiconductor substrate 100 formed with the first and second gates 110a and 110b and the spacer 112. P-type impurities, e.g. boron (B), are ion implanted into the exposed PMOS area to form a boron ion implantation layer 116 within a surface of the semiconductor substrate 100 corresponding to both sides of the first gate 110a formed in the PMOS area.

Figure 2C:
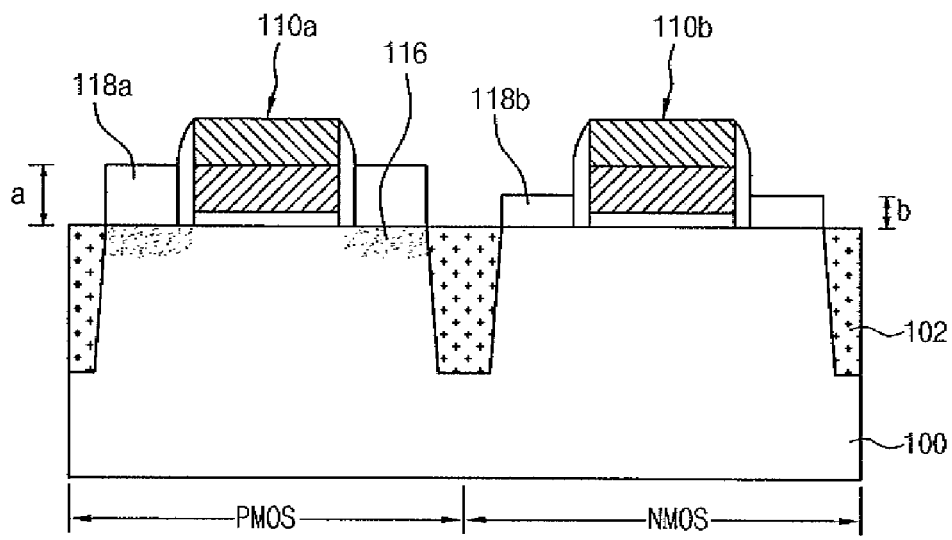

Referring to FIG. 2C, after removal of the mask pattern 114, a first epitaxial layer 118a is grown over the semiconductor substrate 100 corresponding to both sides of the first gate 110a in the PMOS area and a second epitaxial layer 118b is grown over the semiconductor substrate 100 corresponding to both sides of the second gate 110b in the NMOS area. The first and second epitaxial layers 118a and 118b are grown to a SiGe layer through a selective epitaxial growth (SEG) process.

Herein, since the first and second epitaxial layers 118a and 118b will grow at a faster speed over the portion of the semiconductor substrate 100 having a high doping concentration of boron, it is possible to form the first epitaxial layer 118a with a height a higher than that of the second epitaxial layer 118b, height b, over the semiconductor substrate 100 corresponding to both sides of the first gate 110a in the PMOS area (a>b).

Figure 2D:
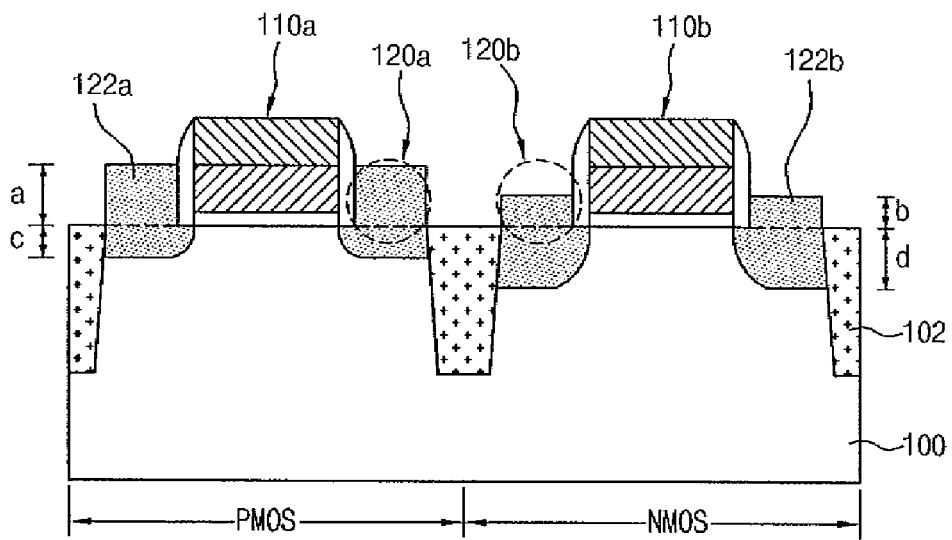

Referring to FIG. 2D, impurities are ion implanted into the first and second epitaxial layers 118a and 118b and the surface of the semiconductor substrate 100 below the epitaxial layers to form a first junction area 122a in a portion of the semiconductor substrate 100 corresponding to both sides of the first gate 110a in the PMOS area and a second junction area 122b in a portion of the semiconductor substrate 100 corresponding to both sides of the second gate 110b in the NMOS area. The first junction area 122a is formed by the ion implantation of P-type impurities and the second junction area 122b is formed by the ion implantation of N-type impurities.

Herein, the height a of the first epitaxial layer 118a formed at both sides of the first gate 110a in the PMOS area prevents the P-type impurities from implanting deeply into the surface of the semiconductor substrate 100 below the first epitaxial layer 118a. As the result, the first junction area 122a in the PMOS area includes the first projection 120a having, on the semiconductor substrate 100, the height a which is higher than the height b of the second projection 120b in the second junction area 122b (a>b), and formed so as to have, within the surface of the semiconductor substrate 100, a depth c shallower than the depth d of the second junction area 122b (c<d).

Also, since the second epitaxial layer 118b having a relatively low height b is formed at both sides of the second gate 110b in the NMOS area, the N-type impurities are ion implanted deeper into the surface of the semiconductor substrate 100 below the second epitaxial layer 118b. As a result, the second junction area 122b formed in the NMOS area includes the second projection 120b having, on the semiconductor substrate 100, the height b lower than the height a of the first projection 120a in the first junction area 122a (b<a), and formed so as to have, within the surface of the semiconductor substrate 100, the depth d deeper than the depth c of the first junction area 122a (d>c).

After that, though not shown, a series of known follow-up processes is sequentially performed, thereby completing the semiconductor device in accordance with an embodiment of the present invention.

Figure 3:
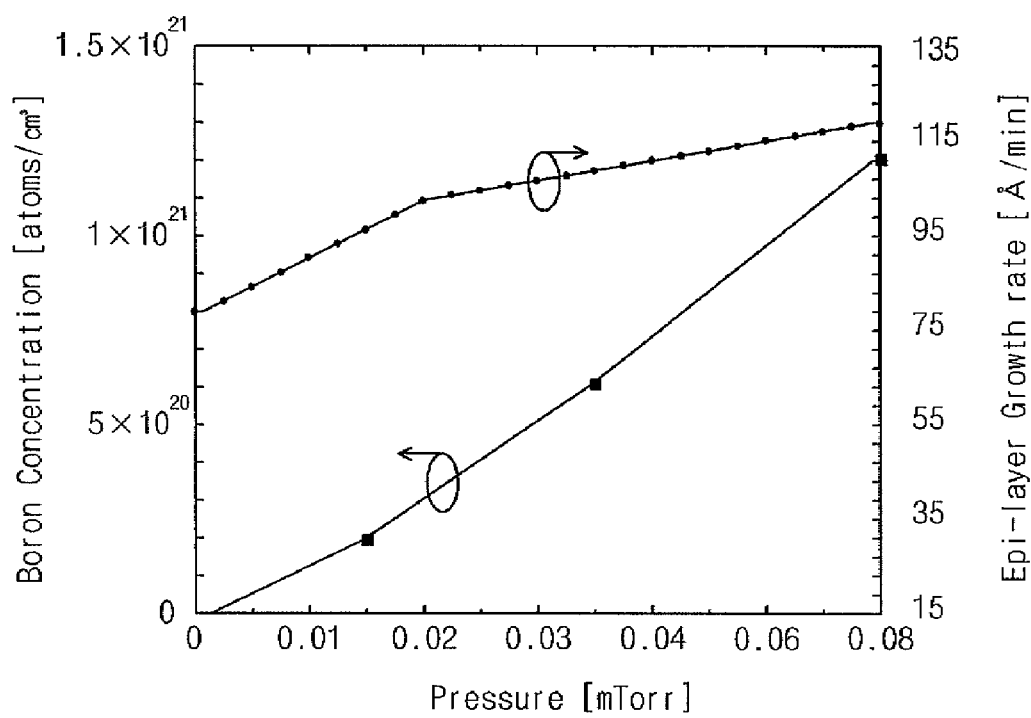
FIG. 3 is a graph showing the relationship between the concentration of boron and the growth rate of an epitaxial layer.

FIG. 3 is a graph showing the relationship between the concentration of boron and the growth rate of an epitaxial layer.

As shown, as the pressure increases, the concentration of boron and the growth rate of an epitaxial layer both increase. In other words, since the pressure and the concentration of boron are proportional to each other and the pressure and the growth rate of an epitaxial layer are proportional to each other, the concentration of boron and the growth rate of an epitaxial layer are also proportional to each other. Therefore, the higher the concentration of boron within the semiconductor substrate is, the faster an epitaxial layer will grow.

As is apparent from the above description, in the present invention, the boron is selectively ion implanted only into the PMOS area of the semiconductor substrate, and the epitaxial layer over the ion implanted portion of the semiconductor substrate therefore has a height higher than that of the epitaxial layer in the NMOS area. Therefore, it is possible to form a junction area in the surface of the semiconductor substrate below the epitaxial layer in the PMOS area with a depth shallower than that of the junction area in the NMOS area. Accordingly, in the present invention, the effect channel length is increased and the short channel effect is therefore improved.

Also, in the present invention, the NMOS area, which has not been ion implanted with boron, is formed with an epitaxial layer having a height lower than that of the epitaxial layer of the PMOS area. Therefore, it is possible to form a junction area having a depth deeper than that of the junction area in the PMOS area in the surface of the semiconductor substrate below the epitaxial layer.

Further, in the present invention, since it is possible to perform the ion implantation using less energy than the prior art, it is possible to reduce current leakage caused by the surface damage created during the ion implantation. Accordingly, in the present invention, the current of the NMOS device is increased and thus the operational characteristics of the device are improved.

Therefore, in the present invention, it is possible to simultaneously improve the short channel effect of the PMOS and the current and operational characteristics of the NMOS, thereby efficiently enhancing the characteristics and reliability of the device.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
    forming first and second gates over PMOS and NMOS areas of a semiconductor substrate, respectively;
    selectively ion implanting boron ions into a surface of the PMOS area of the semiconductor substrate corresponding to both sides of the first gate;
    growing first and second epitaxial layers over a portion of the PMOS area of the semiconductor substrate corresponding to both sides of the first gate and a portion of the NMOS area of the semiconductor substrate corresponding to both sides of the second gate, respectively;
    forming a first junction area in a portion of the PMOS area of the semiconductor substrate corresponding to both sides of the first gate including the first epitaxial layer by ion implantation of P-type impurities; and
    forming a second junction area, having a depth from a surface of the semiconductor substrate deeper than a depth of the first junction area, in a portion of the NMOS area of the semiconductor substrate corresponding to both sides of the second gate including the second epitaxial layer by ion implantation of N-type impurities,
    wherein the step of growing first and second epitaxial layers is implemented such a manner that the first epitaxial layer grow at a faster speed than the second epitaxial layer, thus the first epitaxial layer have a higher height than the second epitaxial layer.

2. The method according to claim 1, wherein the first and second gates are formed in a structure including an $N^+$ polysilicon layer.

3. The method according to claim 1, wherein the step of growing the epitaxial layer is performed through a selective epitaxial growth (SEG) process.

4. The method according to claim 1, wherein the epitaxial layer is grown to a SiGe layer.

* * * * *